US009222970B2

United States Patent
Suzuki et al.

(10) Patent No.: US 9,222,970 B2
(45) Date of Patent: Dec. 29, 2015

(54) FAULT POSITION ANALYSIS METHOD AND FAULT POSITION ANALYSIS DEVICE FOR SEMICONDUCTOR DEVICE

(71) Applicant: FUJI ELECTRIC CO., LTD., Kawasaki-shi (JP)

(72) Inventors: Katsunori Suzuki, Matsumoto (JP); Akihiko Ohi, Matsumoto (JP); Shoji Kitamura, Matsumoto (JP); Takahiro Ooyama, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 336 days.

(21) Appl. No.: 13/671,706

(22) Filed: Nov. 8, 2012

(65) Prior Publication Data

US 2013/0113497 A1    May 9, 2013

(30) Foreign Application Priority Data

Nov. 8, 2011    (JP) .................................. 2011-244102

(51) Int. Cl.
  *G01R 33/02*    (2006.01)
  *G01R 31/311*    (2006.01)

(52) U.S. Cl.
  CPC .................................... *G01R 31/311* (2013.01)

(58) Field of Classification Search
  CPC .................................................... G01R 31/311
  USPC .......................................... 324/244, 525, 752
  See application file for complete search history.

(56) References Cited

U.S. PATENT DOCUMENTS

| | | | |
|---|---|---|---|
| 2004/0185599 A1* | 9/2004 | Harle et al. ..................... 438/98 |
| 2006/0006886 A1* | 1/2006 | Yamashita et al. ............ 324/751 |
| 2006/0164109 A1* | 7/2006 | Terada ................. G01R 31/311 |
| | | | 324/754.23 |
| 2007/0066039 A1 | 3/2007 | Agarwal et al. |

(Continued)

FOREIGN PATENT DOCUMENTS

| | | |
|---|---|---|
| JP | 11-118887 A | 4/1999 |
| JP | 2003066115 A | 3/2003 |
| JP | 2004-264030 A | 9/2004 |

(Continued)

OTHER PUBLICATIONS

Japanese Office Action issued in Japanese counterpart application No. JP2011244102, dated Jul. 14, 2015. Partial English translation provided.

(Continued)

*Primary Examiner* — Melissa Koval
*Assistant Examiner* — Farhana Hoque
(74) *Attorney, Agent, or Firm* — Rossi, Kimms & McDowell LLP

(57) ABSTRACT

A fault position analysis method and a fault position analysis device for a semiconductor device, through which a fault position of a SiC semiconductor device can be analyzed and specified by an OBIRCH method, are disclosed. The fault position analysis method for the semiconductor device scans and irradiates a device and a circuit on a front surface of a substrate with a laser beam from a rear surface side of the substrate of the semiconductor device to heat the device and the circuit. It causes a current to flow to the device and the circuit while being heated, detects a change in a resistance value caused by a change in a current, and analyzes the fault position. The semiconductor device is a semiconductor device which uses an N-doped SiC substrate. Laser beams having wavelengths of 650 to 810 nm are used.

16 Claims, 4 Drawing Sheets

(56) References Cited

U.S. PATENT DOCUMENTS

2010/0319847 A1* 12/2010 Cok et al. .................. 156/272.8
2011/0302753 A1* 12/2011 Shibuya et al. ............. 29/25.42

FOREIGN PATENT DOCUMENTS

| JP | 2009509339 A | 3/2009 |
| JP | 2009-236651 A | 10/2009 |
| JP | 2010197051 A | 9/2010 |
| JP | 2011-149714 A | 8/2011 |
| JP | 2011222607 A | 11/2011 |

OTHER PUBLICATIONS

Ites Co., Ltd "Failure analysis technique of Power MOS Semiconductor" Technical booklet at a seminar of "Failure Analysis Technique of Power MOS Semiconductor" pp. 10-23; date before Oct. 7, 2011. Yasu-city, Shiga Japan. English translation provided.

* cited by examiner

FAULT POSITION ANALYSIS METHOD AND FAULT POSITION ANALYSIS DEVICE FOR SEMICONDUCTOR DEVICE

BACKGROUND OF THE INVENTION

A. Field of the Invention

The present invention relates to a fault position analysis method and a fault position analysis device for a semiconductor device, in which a fault position of the semiconductor device using an N-doped SiC substrate is analyzed by an Optical Beam Induced Resistance Change (OBIRCH) method.

B. Description of the Related Art

Conventionally, the fault positions of a semiconductor device have been specified by a liquid crystal method, an emission microscope, the OBIRCH method, and the like. Among them, the OBIRCH method is an effective method of detecting leakage defects such as disconnections, short circuits, and contact fault, in which the defect portions are irradiated with a laser beam to be locally heated and a resulting change in resistance is detected, thereby specifying the defect position.

As an analysis technique of the OBIRCH method, JP 11-118887 A described below discloses an improved technique in a constant current type beam irradiating, heating, and resistance-change-measuring device which scans and irradiates with a laser beam a sample such as a semiconductor integrated circuit energized by a predetermined constant current, and measures a change in a resistance value of the sample according to the irradiating as a change in a voltage value so as to examine a defect place of the sample.

In addition, JP 2004-264030 A described below discloses a beam irradiating, heating, and resistance-change-measuring device which scans and irradiates with a laser beam a sample energized by a current, and examines a defect place of the sample based on a change in the resistance value of the sample according to the irradiating, in which a magnetic field detecting device is provided on a power line supplying a current to the sample to measure an amount of change in a current flowing to the sample based on a change in magnetic field on the power line which is detected by the magnetic field detecting device.

Furthermore, JP 2009-236651 A described below discloses a defect examining device including a setting unit which sets a second irradiating target portion away from a first irradiating target portion by a predetermined distance based on a thermal distribution in a sample generated when the first irradiating target portion of the sample is irradiated with the laser beam, and an examining unit which irradiates the first irradiating target portion set by the setting unit with the laser beam to examine the first irradiating target unit and, after the examining of the first irradiating target unit, irradiates the second irradiating target portion set by the setting unit with the laser beam to examine the second irradiating target portion.

On the other hand, since the semiconductor device such as a power semiconductor device is configured of metal films formed over the entire surface of an active portion of a front side of the device, in a case where the examination is performed by the OBIRCH method, there is a need to emit a laser beam to the device from the rear surface side thereof to irradiate the defect in the vicinity of the front surface of the device. Likewise, in a case where the device is irradiated with the laser beam from the rear surface side thereof, since there is a need to employ a laser beam having permeability to the Si substrate, a laser beam having a wavelength of 1360 nm, which is equal to or lower than the band gap of Si is used.

In recent years, in a semiconductor device such as the power semiconductor device, a wide-gap semiconductor, for example, SiC and GaN, having a good performance in a withstanding voltage are used, and particularly a SiC semiconductor draws attention as a next-generation semiconductor. The SiC semiconductor device using an N-doped SiC substrate is largely employed.

However, in a case where a sample is a SiC semiconductor device employing the N-doped SiC substrate is electrically defective and thus a leakage current occurs, when measured by a conventional analysis device through the OBIRCH method, a position at which a resistance change occurs is not able to be found, so that it can be seen that the defect position is not able to be specified.

Therefore, a fault position analysis method and a fault position analysis device for a semiconductor device are desired through which a fault position of the SiC semiconductor device can be analyzed and specified through the OBIRCH method.

The present invention is directed to overcoming or at least reducing the effects of one or more of the problems set forth above.

SUMMARY OF THE INVENTION

The inventors of the invention extensively studied to solve the problems described above, and as a result found out that an N-doped SiC substrate has a specific spectrum in which the optical permeability thereof changes depending on a wavelength of light. Further, the inventors have found out that the fault position can be analyzed and specified through the OBIRCH method by performing the irradiating with a laser beam having a specific wavelength in the vicinity of the highest peak of the spectrum.

In other words, a fault position analysis method for the semiconductor device according to the invention includes: scanning and irradiating a device and a circuit on a front surface of a substrate with a laser beam from a rear surface side of the substrate of the semiconductor device to heat the device and the circuit; causing a current to flow to the device and the circuit while being heated; detecting a change in a resistance value caused by a change in a current; and analyzing a fault position, in which the semiconductor device is a semiconductor device which uses an N-doped SiC substrate, and the laser beams having wavelengths of 650 to 810 nm are used.

With the fault position analysis method for the semiconductor device according to the invention, through the irradiating with the laser beams having wavelengths of 650 to 810 nm, from the rear surface side of the substrate of the semiconductor device employing the N-doped SiC substrate, the laser beam can penetrate the substrate to effectively irradiate and heat the device and the circuit on the front surface. Therefore, the fault position can be analyzed and specified through the OBIRCH method.

In addition, the laser beams having wavelengths of 650 to 810 nm have a high transmissivity and are also shifted away from the band edge of SiC to a lower energy side, so that it may largely reduce the chances for the carriers to exceed the band gap at the time of laser excitation so as to cause an OBIC (Optical Beam Induced Current). For this reason, the SN on measuring will increase, and the defect position can be clearly detected.

In the fault position analysis method for the semiconductor device according to the invention, the analyzing of the fault position preferably may be performed after the rear surface of the substrate is processed to be thin such that a thickness of the substrate falls within a range from 20 to 200 μm.

By adjusting the thickness of the substrate to be 20 to 200 μm, the permeability of the laser beam increases without degrading the ability of the substrate to be handled, so that the device and the circuit on the front surface can be effectively irradiated with the laser beam, and the fault position can be easily analyzed by the OBIRCH method.

In addition, in a case where the fault position is specified, the vicinity of the specified position preferably may be irradiated with the laser beam which is increased in its output power, with the laser beams having wavelengths of 455 to 470 nm or 1400 to 2000 nm, or with the laser beam having a wavelength of which transmissivity to the substrate becomes 2% or less, and thus marking is performed thereon.

By increasing the intensity of the laser beams which have wavelengths 650 to 810 nm used in the analysis by the OBIRCH method to perform the irradiating, a thermally damaged portion in the device and the circuit on the front surface is formed by the laser beam, and thus the damaged portion can be marked. In addition, by performing the irradiating with the laser beams having wavelengths of 455 to 470 nm or 1400 to 2000 nm, or by performing the irradiating with the laser beam having a wavelength of which transmissivity to the substrate is 2% or less, the thermally damaged portion in the rear surface of the substrate is formed by the laser beam, and thus the damaged portion can be marked.

In addition, a fault position analysis device for the semiconductor device according to the invention includes: a sample stage on which a target semiconductor device for examination is placed; a laser beam irradiating unit which scans and irradiates the substrate of the semiconductor device from a rear surface side thereof with the laser beam; an energizing unit which causes a current to flow to a device and a circuit of the semiconductor device; and a resistance value measuring unit which detects a change in a resistance value caused by a change in a current flowing to the device and the circuit, in which the semiconductor device is a semiconductor device which uses an N-doped SiC substrate, and the laser beam irradiating unit can perform irradiating with the laser beams having wavelengths of 650 to 810 nm.

With the fault position analysis device for the semiconductor device according to the invention, the target semiconductor device for examination is placed on the sample stage, the laser beam irradiating unit scans and irradiates the semiconductor device from the rear surface side of the substrate of the semiconductor device, the energizing unit causes the current to flow to the device and the circuit of the semiconductor device, the resistance value measuring unit detects the change in the resistance value due to the change in the current flowing to the device and the circuit, and thus the fault position can be analyzed and specified.

Then, by performing the irradiating with the laser beams having wavelengths of 650 to 810 nm by the laser beam irradiating unit from the rear surface side of the substrate of the semiconductor device employing the N-doped SiC substrate, the laser beam can penetrate the substrate to effectively irradiate and heat the device and the circuit on the front surface. Therefore, the fault position can be analyzed and specified through the OBIRCH method. In addition, the SN on measuring will increase, and the defect position can be clearly detected.

In the fault position analysis device for the semiconductor device according to the invention, the rear surface of the substrate of the semiconductor device preferably may be processed to be thin such that a thickness of the substrate thereof falls within a range from 20 to 200 μm.

According to this configuration, as described above, the permeability of the laser beam increases without degrading the ability of the substrate to be handled, so that the device and the circuit on the front surface can be effectively irradiated with the laser beam, and the fault position can be easily analyzed by the OBIRCH method.

In addition, a marking unit may be preferably further included which irradiates the vicinity of the specified fault position with the laser beam which is increased in its output power, irradiates with the laser beams having wavelengths of 455 to 470 nm or 1400 to 2000 nm, or irradiates with the laser beam having a wavelength of which transmissivity to the substrate is 2% or less, and thus marking is performed thereon.

As described above, in a case where the irradiating is performed with the laser beam increased in its intensity, the thermally damaged portion in the device and the circuit on the front surface is formed by the laser beam, and thus the damaged portion can be marked. In addition, in a case where the irradiating is performed with the laser beams having wavelengths of 455 to 470 nm or 1400 to 2000 nm, or with the laser beam having a wavelength of which the transmissivity to the substrate is 2% or less, the thermally damaged portion in the rear surface of the substrate is formed by the laser beam, and thus the damaged portion can be marked.

According to the invention, through the irradiating with the laser beams having wavelengths of 650 to 810 nm, from the rear surface side of the substrate of the semiconductor device employing the N-doped SiC substrate, the laser beam can penetrate the substrate to effectively irradiate and heat the device and the circuit on the front surface. Therefore, the fault position can be analyzed and specified through the OBIRCH method.

In addition, the laser beams having wavelengths of 650 to 810 nm have a high transmissivity and are also shifted away from the band edge of SiC to a lower energy side, so that it may largely reduce the chances for the carriers to exceed the band gap at the time of laser excitation so as to cause an OBIC (Optical Beam Induced Current). For this reason, the SN on measuring will increase, and the defect position can be clearly detected. In this way, since the fault analysis can be achieved, it is possible that the high quality SiC semiconductor devices are produced in large quantities by optimizing a process of manufacturing the semiconductor device.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
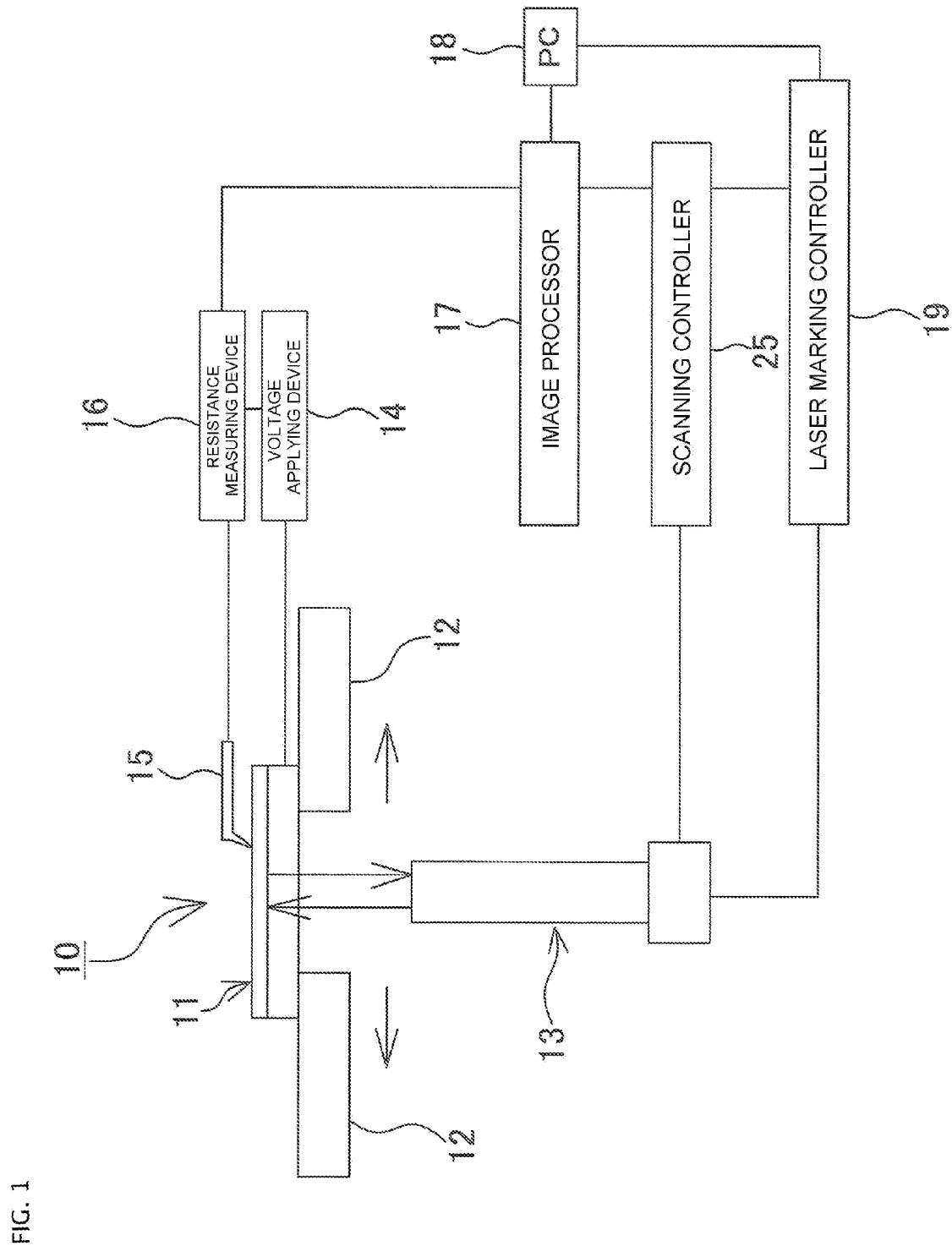
FIG. 1 is a schematic diagram illustrating a fault position analysis device for a semiconductor device according to an embodiment of the invention.

FIG. 1 illustrates a fault position analysis device for a semiconductor device according to an embodiment of the invention. Fault position analysis device 10 for the semiconductor device includes sample stage 12 on which sample 11 is placed. Since sample stage 12 is aligned with respect to a laser beam irradiating unit, which will be described below, in a state where sample 11 is placed, sample stage 12 is preferably configured to be movable in the X-Y direction, and may be configured to be movable in the Z direction.

On the lower side of sample stage 12, confocal laser microscope 13 is disposed as the laser beam irradiating unit according to the invention. Herein, the confocal laser microscope is a microscope which operates in a so-called "confocal system" using a laser beam, and is provided with a mechanism capable of scanning sample 11 with the laser beam moving in the X-Y direction. The focus (beam spot) of the laser beam emitted from the light source is narrowed using an object lens, and an irradiation direction is controlled by built-in mirrors and the like to perform two-dimensional scanning on the sample surface, so that a photodetector detects reflected light and scattered light from the sample surface. The focus formed on the sample surface also serves as a focus of an imaging surface. The reason why the microscope is called the "confocal" system is that only the focus portion is selected and detected.

In the invention, the laser beam irradiating unit is not limited to the confocal laser microscope, and any device may be employed as long as a laser is used as a light source and has a function of irradiating the measurement sample with the narrowed laser beam spot while performing the scanning. In the invention, it is necessary to use a device which can perform the irradiation with a laser beam having a specific wavelength. In this regard, the details will be described below.

The scanning of confocal laser microscope 13 is performed under the control of scanning controller 25.

In addition, there are provided voltage applying device 14 which applies a voltage to sample 11 and probe 15 which is in contact with sample 11 to make the current flow. Voltage applying device 14 and probe 15 constitute an energizing unit according to the invention. In the embodiment, one of the electrodes of voltage applying device 14 is connected to a rear surface of the substrate of a semiconductor device which is sample 11, and the other electrode is connected to a front surface of the substrate of the same semiconductor device through probe 15. In this case, various constructions other than the above-mentioned construction may be employed as the energizing unit.

In a current circuit of the energizing unit, a resistance measuring device 16 is provided as a resistance value measuring unit according to the invention.

Scanning controller 25 and the resistance measuring device 16 are connected to image processor 17, and image processor 17 is further connected to PC (personal computer) 18.

Scanning controller 25 controls the scanning of confocal laser microscope 13. In addition, scanning controller 25 sends image information, which has been sent from confocal laser microscope 13, to image processor 17.

Resistance measuring device 16 operates in synchronization with the operation of irradiating the sample with the laser beam while scanning the sample using confocal laser microscope 13. In this state, resistance measuring device 16 measures a change in a resistance value based on a change in a current value flowing from the energizing unit which includes voltage applying device 14 and probe 15, and then sends the change information to image processor 17.

Image processor 17 plots the change information of the resistance value sent from resistance measuring device 16 onto the image information sent from confocal laser microscope 13 through scanning controller 25. Then, image processor 17 sends the information to PC 18.

PC 18 analyzes a fault place based on data of the change information of the resistance value plotted onto the image information sent from image processor 17. Then, PC 18 may display the position of the fault place in a display device (not illustrated) as image information or position information. Alternatively, the position of the fault place may be stored in a storage unit (not illustrated) or printed using a printer (not illustrated).

The configurations described so far are basically similar to those of the fault position analysis device for the semiconductor device in the related art where the OBIRCH method is employed. In the invention, any device having other configurations may be employed as long as the device performs the analysis using the OBIRCH method.

The feature of fault position analysis device 10 for the semiconductor device according to the invention lies in that the semiconductor device using an N-doped SiC substrate is used as target sample 11 and the employed laser beam irradiating unit (confocal laser microscope 13 in the embodiment) can perform the irradiating with the laser beams having the wavelengths of 650 to 810 nm.

Examples of the semiconductor device using the N-doped SiC substrate targeted in the invention may include a power semiconductor device such as a Schottky barrier diode, a PIN diode, a MOSFET, and an IGBT.

The SiC substrate becomes an n-type SiC substrate with a low resistance in a case of implanting N or P ions therein, and alternatively a p-type SiC substrate with a low resistance in a case of implanting Al or B ions therein. The inventors of the invention have found out that the permeability of the laser beam to the SiC substrate changes depending on spectra which change by wavelengths, and furthermore the spectra change according to the types of ions to be implanted therein.

According to the common technical knowledge so far, it has been considered that in a case of using the laser beams having wavelengths lower than the band gap of the employed substrate, a sufficient permeability is obtained and an Optical Beam Induced Current (OBIC) is suppressed as well. For this reason, the inventors also considered that even a semiconductor device using an SiC substrate would be able to be similarly analyzed on the fault position by the fault position analysis device implementing the conventional OBIRCH method, which was used in the fault position analysis device for the semiconductor device using a Si substrate and in which the irradiating was performed with the laser beam having the wavelength of 1360 nm. Through an experiment, it was found out that the device could not find the position at which the resistance change occurred and thus the specifying of the defect position was failed.

Figure 2:
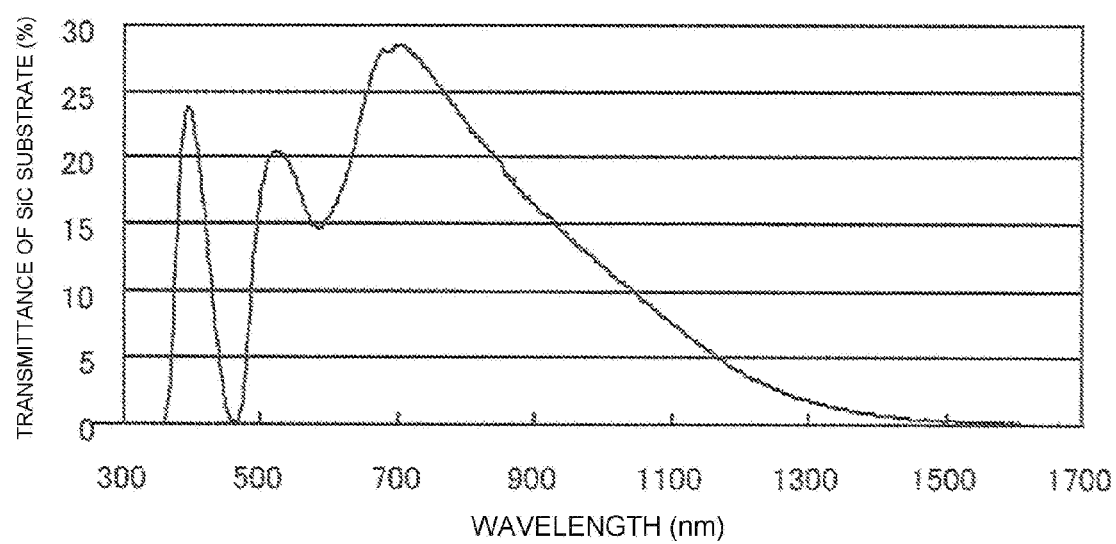
FIG. 2 is a graph illustrating a transmission spectrum of an N-doped SiC substrate.

Thus, the transmissivity was measured in the N-doped SiC substrate by a spectral photometer to acquire the transmission spectrum according to the wavelength, and the result as illustrated in FIG. 2 was obtained.

In other words, the reason why the defect position of the N-doped SiC substrate was not able to be specified by the conventional fault position analysis device was that the transmissivity of the laser beam having a wavelength of 1360 nm to the N-doped SiC substrate was extremely low, and thus the laser beam did not cause sufficient heating. Therefore, it resulted that the resistance change could not be measured at a high SN.

Thus, the analysis experiment on the fault position has been repeatedly performed by selecting various wavelengths of the irradiation laser beam based on the transmission spectrum of the N-doped SiC substrate illustrated in FIG. 2, and finally the inventors have reached the fact that the fault place is clearly detected to specify the fault position by using the laser beams having wavelengths of 650 to 810 nm.

As a laser which can emit the laser beams having wavelengths of 650 to 810 nm, a gas or semiconductor laser may be used which emits the laser beam stably oscillating in a wavelength of 658, 670, 685, 780, or 808 nm. In particular, the semiconductor laser which emits the laser beam oscillating in a wavelength of 685 nm is preferably used.

In addition, since the transmissivity of the laser beam is high, it is preferable that the rear surface of the substrate be processed to be thin as needed such that the thickness of the same substrate of the semiconductor device falls within a range from 20 to 200 μm, and then the analysis on the fault position be performed. In a case where the thickness of the substrate is less than 20 μm, the substrate may be easily broken, so that its ability to be handled is degraded. In a case where the thickness of the substrate exceeds 200 μm, the amount of transmitted light may be short depending on the strength of the laser beam, so that the heating is likely not to be effectively made.

The substrate of the SiC semiconductor device can be thinned such that the electrodes and the like on the rear surface of the substrate are peeled off through an immersing process using aqua regia and then the substrate is subjected to a polishing process or the like.

Furthermore, in fault position analysis device 10 of the semiconductor device according to the invention, in a case where the fault position is specified, it is preferable to provide a marking unit which performs marking on the vicinity of the place at that position by irradiating the vicinity with the laser beam increased in its output power or by irradiating the vicinity with the laser beam which has a low-penetrable wavelength with respect to the substrate.

In the embodiment, confocal laser microscope 13 serving as the laser beam irradiating unit is provided with a unit configured to perform the irradiating with the laser beam increased in its output power or a unit configured to perform the irradiating with the laser beam having a low-penetrable wavelength with respect to the N-doped SiC substrate. Then, these units are configured to be controlled by laser marking controller 19 connected to the PC.

As the unit for the irradiating with the laser beam increased in its output power, a unit may be employed which irradiates the place to be marked with the laser beam increased in its output power through a pulsed manner or the like, using a laser which emits the laser beams oscillating in wavelengths of 650 to 810 nm for analyzing the fault position. With the use of the unit for the irradiating with the laser beam increased in its output power, it is possible to mark the device and the circuit on the front surface of the substrate of the semiconductor device.

In addition, as a unit configured to perform the irradiating with the laser beam having a low-penetrable wavelength with respect to the N-doped SiC substrate, a unit may be employed which performs the irradiating with the laser beam having a wavelength in the vicinity of the valley of the transmission spectrum illustrated in FIG. 2. Specifically, the gas laser or the semiconductor laser may be used which can emit the laser beams having wavelengths of 455 to 470 nm and 1400 to 2000 nm. In addition, a unit may be employed which emits the laser beam having a wavelength of which transmissivity to the N-doped SiC substrate becomes 2% or less. With the use of the laser beam having a low-penetrable wavelength to the N-doped SiC substrate, it is possible to mark the rear surface of the substrate of the semiconductor device.

Next, the fault position analysis method for the semiconductor device according to an embodiment of the invention will be described. The fault position analysis method for the semiconductor device according to the invention, for example, may employ fault position analysis device 10 described above.

First, in a case where layers serving to block the transmission of the laser beam, for example, metal electrode layers are formed on the rear surface of the substrate of the semiconductor device using the N-doped SiC substrate, the layers are peeled off through the method as described above. Next, in a case where the thickness of the substrate exceeds 200 μm, the substrate is processed through the method as described above such that the thickness preferably falls within a range from 20 to 200 μm. In this case, if the strength of the laser beam to be used is sufficiently large, even the substrate having the thickness exceeding 200 μm may be analyzed.

The semiconductor device (sample 11) which has been made as thin as necessary is placed on sample stage 12 such that the rear surface of the substrate faces the laser beam irradiating unit (confocal laser microscope 13 in the embodiment). Sample stage 12 moves sample 11 such that the target area of sample 11 for examination directly faces confocal laser microscope 13.

Next, one of the electrodes of voltage applying device 14 is brought into contact with the rear surface of the substrate of sample 11, and the other electrode is brought into contact with the device and the circuit, for example, the electrode layers on the front surface of the substrate through probe 15. In this state, voltage applying device 14 applies a predetermined voltage to the semiconductor device, which is sample 11, to perform energizing.

Meanwhile, scanning controller 25 causes confocal laser microscope 13 to make a control of irradiating sample 11 from the rear surface side of the substrate thereof while emitting the laser beams having wavelengths of 650 to 810 nm. When the laser beam is emitted to the device and the circuit on the front surface of the substrate, the components are locally heated and thus the resistance values thereof change, so that the current value passing through the semiconductor device which is sample 11 changes. Based on the change in the current value, resistance measuring device 16 measures the change in the resistance value and sends the information to image processor 17.

At this time, since the wavelengths of 650 to 810 nm are used for the laser beam, the N-doped SiC substrate is transmitted sufficiently, the device and the circuit on the front surface of the substrate are effectively irradiated with the laser beam, and the local heating is preferably achieved, so that the information on the change resistance can be obtained at a high SN.

On the other hand, scanning controller 25 sends the image information (which is image information created based on reflected light, transmitted light, fluorescence, and the like generated by the irradiating with the laser beam) which is obtained by confocal laser microscope 13 to image processor 17.

Image processor 17 plots the change information on the resistance value sent from resistance measuring device 16 onto the image information sent from scanning controller 25, and sends the information to PC 18.

PC 18 analyzes a fault place based on data of the change information of the resistance value plotted onto the image information sent from image processor 17. Then, PC 18 may display the position of the fault place in a display device (not illustrated) as image information or position information. Alternatively, the position of the fault place may be stored in a storage unit (not illustrated) or printed using a printer (not illustrated). In this way, the position of the fault place is specified by PC 18, and displayed in the display device or the like.

The image information obtained as described above, for example, is displayed such that portions having high resistance values are dark and portions having low resistance values are bright. Thus, normal portions such as wiring portions are displayed dark, and if there is a disconnect in the wiring portions, a bright portion is displayed in the middle of the dark portions. In a case where there is foreign matter increasing the conductivity when heated, the portion is displayed extremely bright, so that the fault place can be specified.

On the other hand, when the position of the fault place is specified, PC 18 sends a control signal to laser marking controller 19. PC 18 causes laser marking controller 19 to irradiate the specified position with the marking laser beam from confocal laser microscope 13.

As described above, the laser beam includes the unit which irradiates the place to be marked with the laser beam increased in its output power through a pulsed manner or the like, using a laser which emits the laser beams oscillating in wavelengths of 650 to 810 nm for analyzing the fault position, or the unit configured to perform the irradiating with the laser beam having a low-penetrable wavelength with respect to the N-doped SiC substrate. In the former case, the marking can be implemented on the device and the circuit on the front surface of the substrate of the semiconductor device, and in the latter case, the marking can be performed on the rear surface of the substrate of the semiconductor device. Herein, the low-penetrable wavelength with respect to the N-doped SiC substrate may range from 455 to 470 nm or from 1400 to 2000 nm, or may be the wavelength of which transmissivity to the N-doped SiC substrate becomes 2% or less.

In this way, after the marking is performed on the vicinity of the fault position, the inner structure is examined in detail focusing around the marked position, using an electronic microscope or the like. Therefore, it is possible to find out the exact position of the fault place, the cause of the fault, and the like.

EXAMPLE

Hereinafter, examples of the invention and comparative examples will be described.

Examples 1 to 8, Comparative Examples 1 to 4

Figure 3:
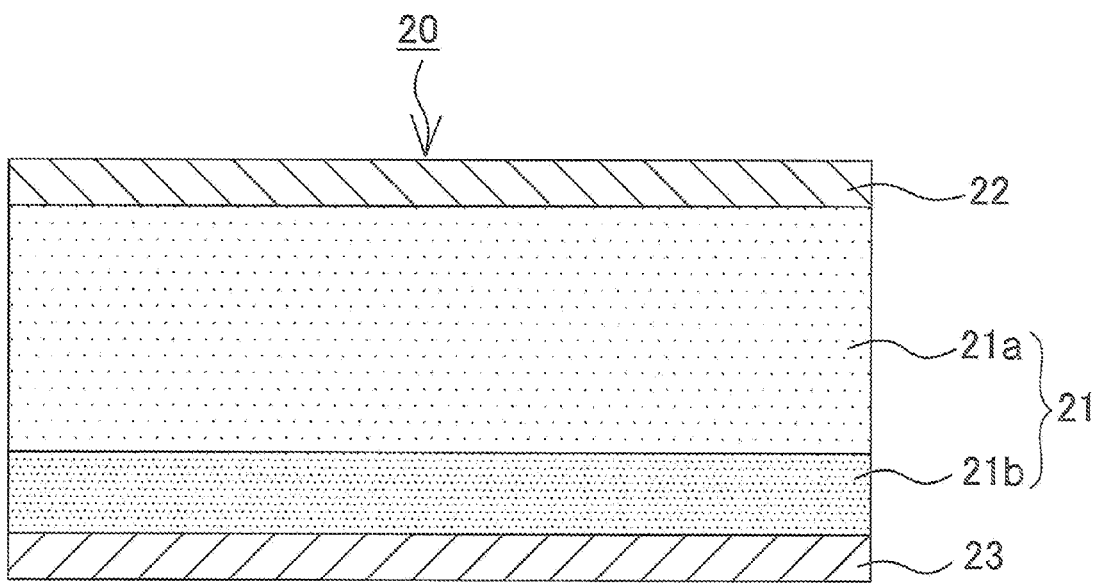
FIG. 3 is a cross-sectional view illustrating a Schottky barrier diode including a SiC substrate.

The Schottky barrier diode illustrated in FIG. 3 was manufactured through a typical method. Schottky barrier diode 20 was configured to include N-doped SiC substrate 21, anode electrode (a Schottky electrode) 22 which includes Ti/Al (Ti was formed as a boundary to SiC, and Al was formed as a layer thereon) formed on the front surface of the N-doped SiC substrate, and cathode electrode (an ohmic electrode) 23 which included Ni/Ti/Al (Ni is formed as a boundary to SiC, and Ti and Al are formed as layers thereon) formed on the rear surface. N-doped SiC substrate 21 was configured to include drift layer 21a and cathode layer 21b. The thickness of N-doped SiC substrate 21 was 350 μm.

Figure 4:
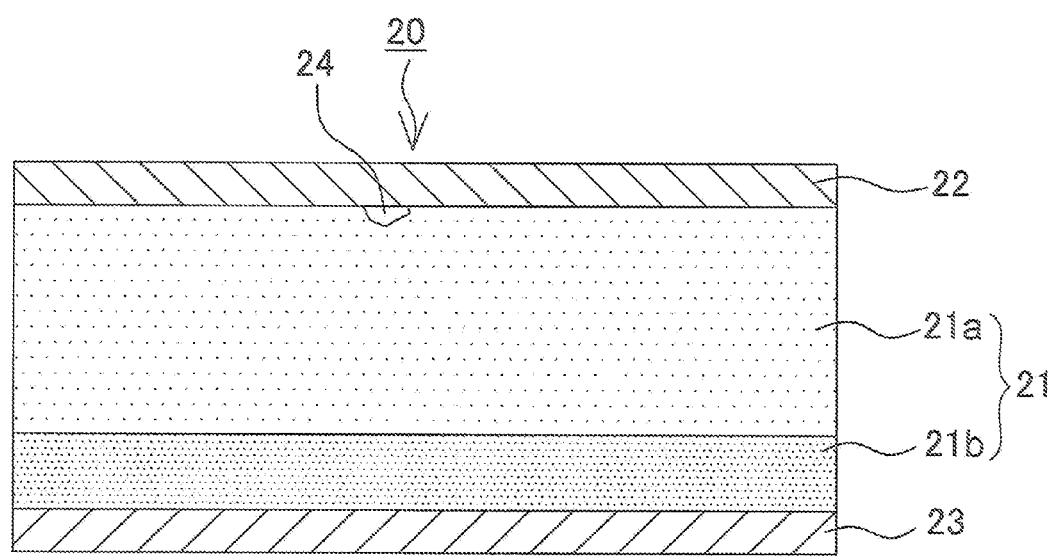
FIG. 4 is a cross-sectional view illustrating a Schottky barrier diode including the SiC substrate, which has been used as a sample for examination.

In the front surface of the chip of Schottky barrier diode 20, high concentrated P-type ions ($10^{21}$ atoms/cm$^3$) were implanted to form a ϕ1 μm pattern, and as illustrated in FIG. 4, the sample having portion 24 as an ohmic contact formed in anode electrode (the Schottky electrode) 22 was prepared.

Cathode electrode (the ohmic electrode) 23 on the rear surface of the sample was peeled off using aqua regia, and the polishing was performed from the rear surface side using a surface polishing device, and thus the respective samples of N-doped SiC substrates 21 having board thicknesses of 20, 50, 100, and 200 μm were prepared. In addition, also a sample of N-doped SiC substrate 21 having the board thickness of 350 μm was prepared which corresponded to the thickness in case of peeling off just cathode electrode (the ohmic electrode) 23.

With the use of these samples, the fault position (the position of portion 24 as the ohmic contact) was analyzed through the OBIRCH method while changing the wavelength of the laser beam by the fault position analysis device 10 for the semiconductor device which was configured as illustrated in FIG. 1, and then the possibility to specify the fault position was investigated.

In other words, as listed in Table 1 below, while changing the wavelength of the laser beam and the thickness of substrate 21, the detectability of the fault place through the OBIRCH method was experimented. Further, the incident intensity of the laser beam was set to 100 mW in all cases.

The results are listed in Table 1. In Table 1, ⊙ represents that the fault place was able to be clearly detected, ○ represents that the fault place was able to be detected, and x represents that the fault place was not able to be detected.

TABLE 1

| Examples | Wavelength of Laser beam (nm) | Board thickness of Substrate | Detectability of OBIRCH |
|---|---|---|---|
| Example 1 | 658 | 100 | ⊙ |
| Example 2 | 685 | 100 | ⊙ |
| Example 3 | 808 | 100 | ⊙ |
| Example 4 | 658 | 200 | ○ |
| Example 5 | 685 | 200 | ○ |
| Example 6 | 808 | 200 | ○ |
| Example 7 | 685 | 20 | ⊙ |
| Example 8 | 685 | 50 | ⊙ |
| Example 9 | 685 | 350 | x |
| Comparative example 1 | 532 | 100 | ○ |
| Comparative example 2 | 1300 | 100 | x |
| Comparative example 3 | 532 | 200 | x |
| Comparative example 4 | 1300 | 200 | x |

From the results listed in Table 1, in a case where the wavelengths of the laser beam are 658 nm, 685 nm, and 808 nm, it can be seen that the fault place is able to be detected through the OBIRCH method whether the thickness of the substrate is 100 μm or 200 μm (see Examples 1 to 9).

In addition, in a case where the wavelength of the laser beam is 532 nm, it can be seen that if the thickness of the substrate is 100 μm, the fault place is able to be detected through the OBIRCH method, but if the thickness of the substrate was 200 μm, the detection is not able to be done (see Comparative examples 1 and 3).

Furthermore, in a case where the wavelength of the laser beam is 1300 nm, whether the thickness of the substrate is 100 μm or 200 μm, the fault place is not able to be detected through the OBIRCH method (see Comparative examples 2 and 4).

In addition, it can be seen that in a case where the thickness of the substrate is 350 μm, even if the wavelength of the laser beam is 685 nm, the fault place is not able to be detected (see Example 9). In this case, even though the thickness of the substrate is 350 µm, the fault position is able to be detected by increasing the intensity of the laser beam.

Thus, a fault position analysis method and a fault position analysis device for a semiconductor device has been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

EXPLANATIONS OF LETTERS OR NUMERALS

10: fault position analysis device for semiconductor device
11: sample (target semiconductor device for examination)
12: sample stage
13: confocal laser microscope
14: voltage applying device
15: probe
16: resistance measuring device
17: image processor
18: PC (personal computer)
19: laser marking controller
25: scanning controller

What is claimed is:

1. A fault position analysis method for a semiconductor device, the method comprising:
    scanning and irradiating a device and a circuit located on a front surface of a substrate with a laser beam to heat the device and the circuit from a rear surface side of the substrate of the semiconductor device;
    causing a current to flow to the device and circuit while being heated;
    detecting a change in a resistance value caused by a change in a current; and
    identifying a fault position,
    wherein the semiconductor device is a semiconductor device with an N-doped SiC substrate and wherein the laser beam has a wavelengths of 650 to 810 nm.

2. The fault position analysis method for the semiconductor device according to claim 1, wherein the analyzing of the fault position is performed after thinning the rear surface of the substrate so that a thickness of the substrate falls within a range from 20 to 200 µm.

3. The fault position analysis method for the semiconductor device according to claim 2, wherein, when a fault position is identified, output power of the laser beam is increased in the vicinity of the identified position to mark the fault position.

4. The fault position analysis method for the semiconductor device according to claim 2, wherein, when a fault position is identified, a laser beam having wavelength of 455 to 470 nm or 1400 to 2000 nm marks the fault position.

5. The fault position analysis method for the semiconductor device according to claim 2, wherein, when a fault position is identified, a laser beam having a wavelength of which transmissivity to the substrate becomes 2% or less marks the fault position.

6. The fault position analysis method for the semiconductor device according to claim 1, wherein, when a fault position is identified, output power of the laser beam is increased in the vicinity of the identified position to mark the fault position.

7. The fault position analysis method for the semiconductor device according to claim 1, wherein, when a fault position is identified, a laser beam having wavelength of 455 to 470 nm or 1400 to 2000 nm marks the fault position.

8. The fault position analysis method for the semiconductor device according to claim 1, wherein, when a fault position is identified, a laser beam having a wavelength of which transmissivity to the substrate becomes 2% or less to mark the fault position.

9. A fault position analysis device for a semiconductor device, comprising:
    a sample stage on which a target semiconductor device for examination is placed;
    a laser beam irradiating unit which scans and irradiates the target semiconductor device with the laser beam from a rear surface side of the substrate of the semiconductor device;
    an energizing unit which causes a current to flow to a device and a circuit of the semiconductor device; and
    a resistance value measuring unit which detects a change in a resistance value caused by a change in a current flowing to the device and the circuit,
    wherein the semiconductor device is a semiconductor device which uses an N-doped SiC substrate, and wherein the laser beam irradiating unit irradiates laser beams having wavelengths of 650 to 810 nm.

10. The fault position analysis device for the semiconductor device according to claim 9, wherein the rear surface of the substrate has a thickness within a range from 20 to 200 µm.

11. The fault position analysis device for the semiconductor device according to claim 10, further comprising a marking unit which irradiates the vicinity of the specified fault position with a laser beam that is increased in its output power to mark the fault position.

12. The fault position analysis device for the semiconductor device according to claim 10, further comprising a marking unit with laser beams having wavelengths of 455 to 470 nm or 1400 to 2000 nm which irradiate the vicinity of the specified fault position to mark the fault position.

13. The fault position analysis device for the semiconductor device according to claim 10, further comprising a marking unit with a laser beam having a wavelength of which transmissivity to the substrate is 2% or less to mark the fault position.

14. The fault position analysis device for the semiconductor device according to claim 9, further comprising a marking unit which irradiates the vicinity of the specified fault position with a laser beam that is increased in its output power to mark the fault position.

15. The fault position analysis device for the semiconductor device according to claim 9, further comprising a marking unit with laser beams having wavelengths of 455 to 470 nm or 1400 to 2000 nm which irradiate the vicinity of the specified fault position to mark the fault position.

16. The fault position analysis device for the semiconductor device according to claim 9, further comprising a marking unit with a laser beam having a wavelength of which transmissivity to the substrate is 2% or less to mark the fault position.

* * * * *